US012588464B2

(12) United States Patent \
Kim

(10) Patent No.: US 12,588,464 B2 \
(45) Date of Patent: Mar. 24, 2026

(54) MODULE TRAY FOR SEMICONDUCTOR DEVICE

(71) Applicant: Samsung Electronics Co., Ltd., Suwon-si (KR)

(72) Inventor: Taegeon Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/586,791

(22) Filed: Feb. 26, 2024

(65) Prior Publication Data

US 2024/0404855 A1 Dec. 5, 2024

(30) Foreign Application Priority Data

May 31, 2023 (KR) ........................ 10-2023-0069924

(51) Int. Cl. \
H01L 21/673 (2006.01)

(52) U.S. Cl. \
CPC .............................. H01L 21/67333 (2013.01)

(58) Field of Classification Search \
CPC ........... H01L 21/67333; H01L 21/6734; H01L 21/67346; H01L 21/67383; H01L 21/67386 \
USPC ........ 206/706, 707, 710, 711, 712, 560, 453 \
See application file for complete search history.

(56) References Cited

U.S. PATENT DOCUMENTS

| | | | |
|---|---|---|---|
| 6,914,771 B2 * | 7/2005 | Ono ................... | H05K 13/0084 |
| | | | 206/725 |
| 7,609,334 B2 | 10/2009 | Lee | |
| 7,731,029 B2 | 6/2010 | Su | |
| 9,181,747 B2 | 11/2015 | Shim et al. | |
| 2003/0230512 A1 | 12/2003 | Yeh | |
| 2006/0280591 A1 * | 12/2006 | Sisson ............... | H01L 21/67333 |
| | | | 414/806 |
| 2011/0089079 A1 * | 4/2011 | Lo ..................... | H01L 21/67333 |
| | | | 206/711 |
| 2014/0262928 A1 * | 9/2014 | Han ................... | G01R 31/2893 |
| | | | 206/711 |

(Continued)

FOREIGN PATENT DOCUMENTS

| | | |
|---|---|---|
| JP | H05-010280 A | 1/1993 |
| JP | 6593430 B2 | 10/2019 |

(Continued)

*Primary Examiner* — Rafael A Ortiz \
(74) *Attorney, Agent, or Firm* — HARNESS, DICKEY & PIERCE, P.L.C.

(57) ABSTRACT

A module tray for a semiconductor device includes a case body defining at least one cavity therein to accommodate a semiconductor substrate on a bottom surface of the cavity. The case body defining first and second inner walls of the at least one cavity extending parallel to each other in a first horizontal direction and having first and second end portions, third and fourth inner walls of the at least one cavity extending parallel to each other in a second horizontal direction orthogonal to the first horizontal direction and having third and fourth end portions, and first to fourth guide grooves of the at least one cavity respectively extending to connect the first to fourth end portions to each other, the first to fourth guide grooves having a concave shape to be spaced apart from corner portions of the semiconductor substrate that is accommodated into the cavity.

18 Claims, 8 Drawing Sheets

(56)                    References Cited

U.S. PATENT DOCUMENTS

| 2016/0083834 A1* | 3/2016 | Yamazaki | C23C 14/042 |
| | | | 118/728 |
| 2016/0086834 A1* | 3/2016 | Kim | H01L 21/67333 |
| | | | 206/710 |
| 2017/0162411 A1* | 6/2017 | Pei | H01L 21/67333 |
| 2019/0074202 A1* | 3/2019 | Kim | H01L 24/81 |
| 2021/0327731 A1* | 10/2021 | Chang | H01L 21/68714 |

FOREIGN PATENT DOCUMENTS

| JP | 2021-0190580 A | | 12/2021 |
| KR | 1999-0038919 A | | 6/1999 |
| KR | 2008-0004116 A | | 1/2008 |
| KR | 10-2001134 B1 | | 7/2019 |
| KR | 20200131183 | * | 11/2020 |

* cited by examiner

X DIRECTION

Y DIRECTION

12

X DIRECTION

Y DIRECTION

FIG. 11

MODULE TRAY FOR SEMICONDUCTOR DEVICE

CROSS REFERENCE TO RELATED APPLICATION(S)

This application claims priority under 35 U.S.C. § 119 to Korean Patent Application No. 10-2023-0069924, filed on May 31, 2023 in the Korean Intellectual Property Office (KIPO), the contents of which are herein incorporated by reference in their entirety.

BACKGROUND

1. Field

Example embodiments relate to a module tray for a semiconductor device. More particularly, example embodiments relate to a module tray for a semiconductor device for accommodating a plurality of semiconductor substrates therein.

2. Description of the Related Art

A module tray may be used to store and operate a plurality of semiconductor substrates. Since an internal accommodating space of the module tray is narrow, a collision may occur between the module tray and the semiconductor substrate while the semiconductor substrate is inserted and accommodated into the accommodating space in the module tray. Corner portions of the semiconductor substrate may collide with corners of the accommodating space, thereby causing damage or cracks in the corner portions of the semiconductor substrate.

SUMMARY

Example embodiments provide a module tray for a semiconductor device having a structure capable of protecting a semiconductor substrate in a process of accommodating the semiconductor substrate into an accommodating space of the module tray.

Embodiments of the inventive concepts provide a module tray for a semiconductor device that includes a case body defining at least one cavity therein to accommodate a semiconductor substrate on a bottom surface thereof. The case body defines first and second inner walls of the at least one cavity extending parallel to each other in a first horizontal direction, the first and second inner walls having first and second end portions that are inclined at first and second inclination angles with respect to the bottom surface, respectively; third and fourth inner walls of the at least one cavity extending parallel to each other in a second horizontal direction orthogonal to the first horizontal direction, the third and fourth inner walls having third and fourth end portions that are inclined at third and fourth inclination angles with respect to the bottom surface, respectively; and first to fourth guide grooves respectively extending to connect the first to fourth end portions to each other, the first to fourth guide grooves having a concave shape and spaced apart from corner portions of the semiconductor substrate that is accommodated into the cavity.

Embodiments of the inventive concepts further provide a module tray for a semiconductor device that includes a case body having a base plate, and defining at least one cavity therein an accommodating space for accommodating a semiconductor substrate. The case body defines first and second inner walls of the at least one cavity respectively extending in a first horizontal direction, the first and second inner walls having first and second end portions that are inclined at first and second inclination angles with respect to a bottom surface thereof, respectively; third and fourth inner walls of the at least one cavity respectively extending in a second horizontal direction orthogonal to the first horizontal direction, the third and fourth inner walls having third and fourth end portions that are inclined at third and fourth inclination angles with respect to the bottom surface, respectively; and first to fourth guide grooves extending from the first to fourth end portions and having a continuous curved surface, the first to fourth guide grooves having a concave shape that guides the semiconductor substrate into the accommodating space.

Embodiments of the inventive concepts still further provide a module tray for a semiconductor device that includes a case body having a base plate, and defining at least one cavity therein as an accommodating space to accommodate a semiconductor substrate. The case body defines first and second inner walls of the at least one cavity extending parallel to each other in a first horizontal direction, the first and second inner walls having first and second end portions inclined at first and second inclination angles with respect to the base plate, respectively; third and fourth inner walls of the at least one cavity extending parallel to each other in a second horizontal direction orthogonal to the first horizontal direction, the third and fourth inner walls having third and fourth end portions inclined at third and fourth inclination angles with respect to the base plate, respectively; and first to fourth guide grooves extending from the first to fourth end portions and having a continuous curved surface, the first to fourth guide grooves having a half funnel shape narrowing toward the base plate to guide corner portions of the semiconductor substrate to the accommodating space, respectively.

According to some example embodiments, a module tray for a semiconductor device may include a case body, and at least one cavity within the case body to accommodate a semiconductor substrate on a bottom surface thereof. The at least one cavity includes first and second inner walls extending parallel to each other in a first horizontal direction, the first and second inner walls having first and second end portions that are inclined at first and second inclination angles with respect to the bottom surface, respectively; third and fourth inner walls extending parallel to each other in a second horizontal direction orthogonal to the first horizontal direction, the third and fourth inner walls having third and fourth end portions that are inclined at third and fourth inclination angles with respect to the bottom surface, respectively; and first to fourth guide grooves respectively extending to connect the first to fourth end portions to each other, the first to fourth guide grooves having a concave shape to be spaced apart from corner portions of the semiconductor substrate that is accommodated into the at least one cavity.

Thus, the semiconductor substrate may be accommodated into the cavity of the module tray. In a process of accommodating the semiconductor substrate in the cavity, the corner portions of the semiconductor substrate may collide with an upper surface of the case body. Since the first to fourth guide grooves of the cavity have a concave shape from the first to fourth inner walls, a collision occurring between the corner portions of the semiconductor substrate and the first to fourth inner walls may be limited or prevented.

Further, the first to fourth end portions of the first to fourth inner walls may be inclined at the first to fourth inclination angles, respectively. Since the first to fourth end portions are inclined at the first to fourth inclination angles, the semiconductor substrate may be slidably accommodated into the accommodating space, and impact generated between the semiconductor substrate and the case body may be alleviated or absorbed.

Since the first to fourth guide grooves smoothly connect the first to fourth end portions through predetermined inclination angles, when the corner portions of the semiconductor substrate collide with the first to fourth guide grooves, an impact applied to the corner portions of the semiconductor substrate may be alleviated or absorbed.

BRIEF DESCRIPTION OF THE DRAWINGS

Example embodiments will be more clearly understood from the following detailed description taken in conjunction with the accompanying drawings. FIGS. 1 to 11 represent non-limiting, example embodiments as described herein.

FIG. 1 is a perspective view illustrating a module tray for a semiconductor device in accordance with some example embodiments.

FIG. 2 is a plan view illustrating the module tray in FIG. 1.

FIG. 3 is an enlarged perspective view illustrating portion 'A' in FIG. 1.

FIG. 4 is a plan view illustrating portion 'A' in FIG. 1.

FIG. 5 is a cross-sectional view taken along line B-B' in FIG. 3.

FIG. 6 is a plan view illustrating a module tray for a semiconductor device having guide grooves of a modified shape in accordance with some example embodiments.

Figure 11:
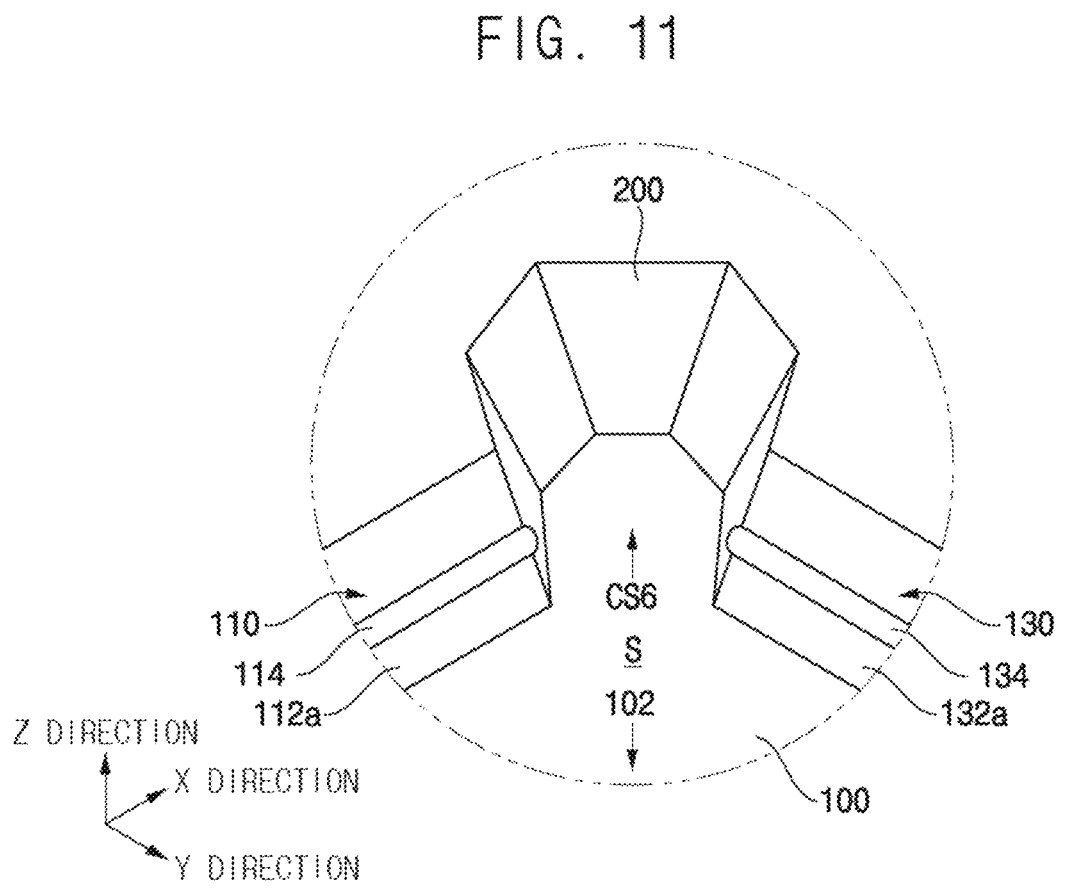

FIGS. 7, 8, 9, 10 and 11 are enlarged perspective views illustrating portion 'C' in FIG. 6 in accordance with some example embodiments.

DETAILED DESCRIPTION

Hereinafter, example embodiments will be explained in detail with reference to the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Also, for example, "at least one of A, B, and C" and similar language (e.g., "at least one selected from the group consisting of A, B, and C") may be construed as A only, B only, C only, or any combination of two or more of A, B, and C, such as, for instance, ABC, AB, BC, and AC.

Figure 1:
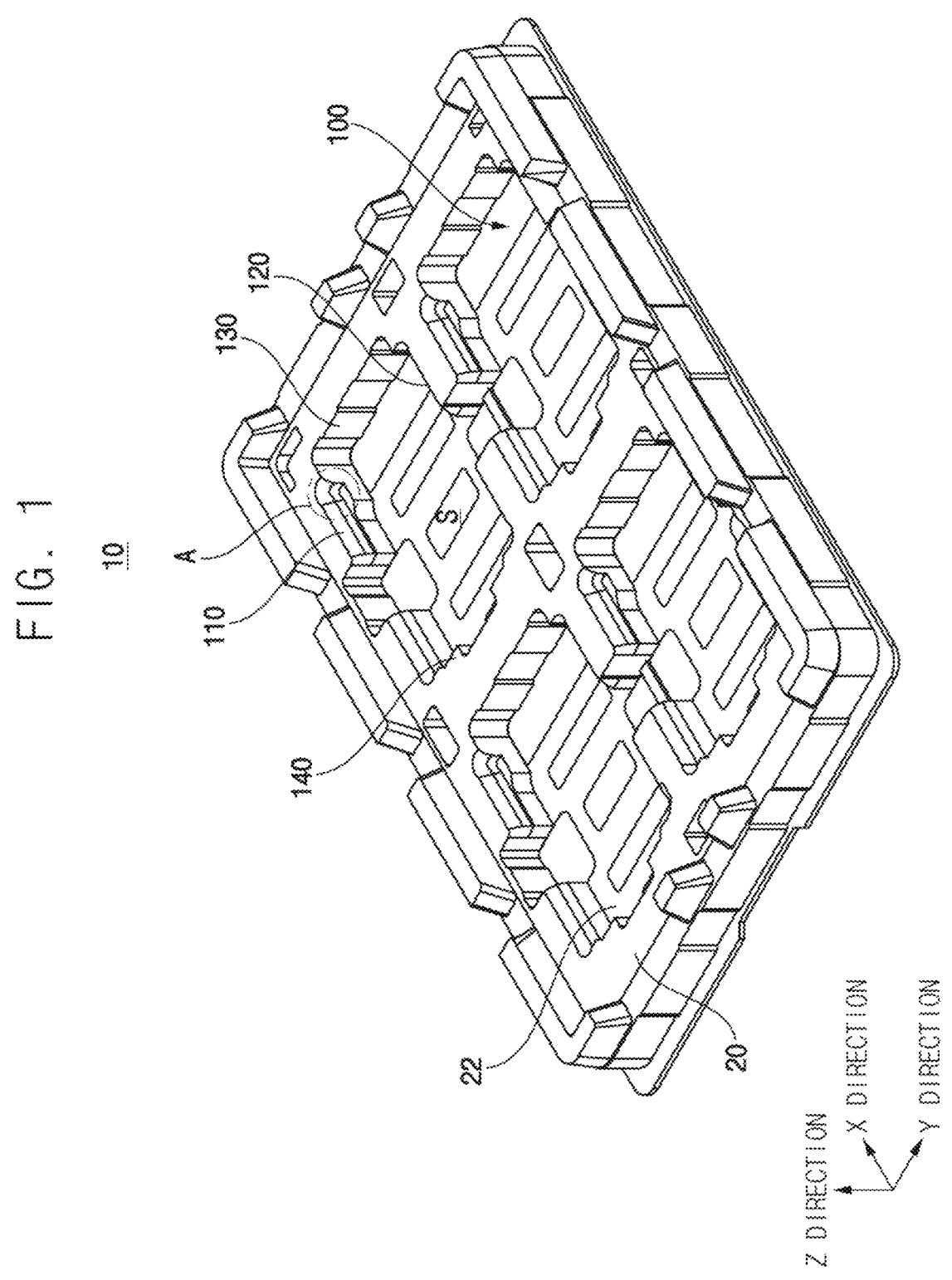
Figure 2:
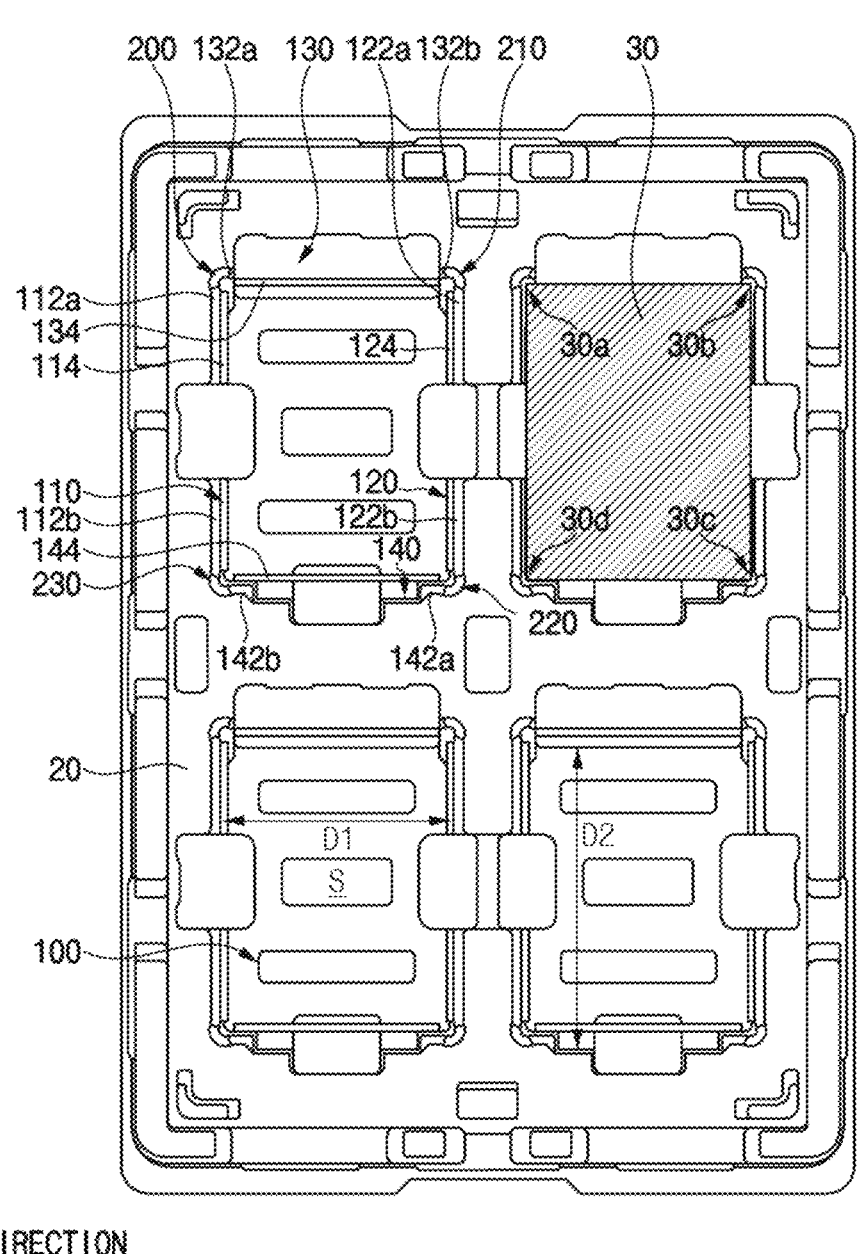
Figure 3:
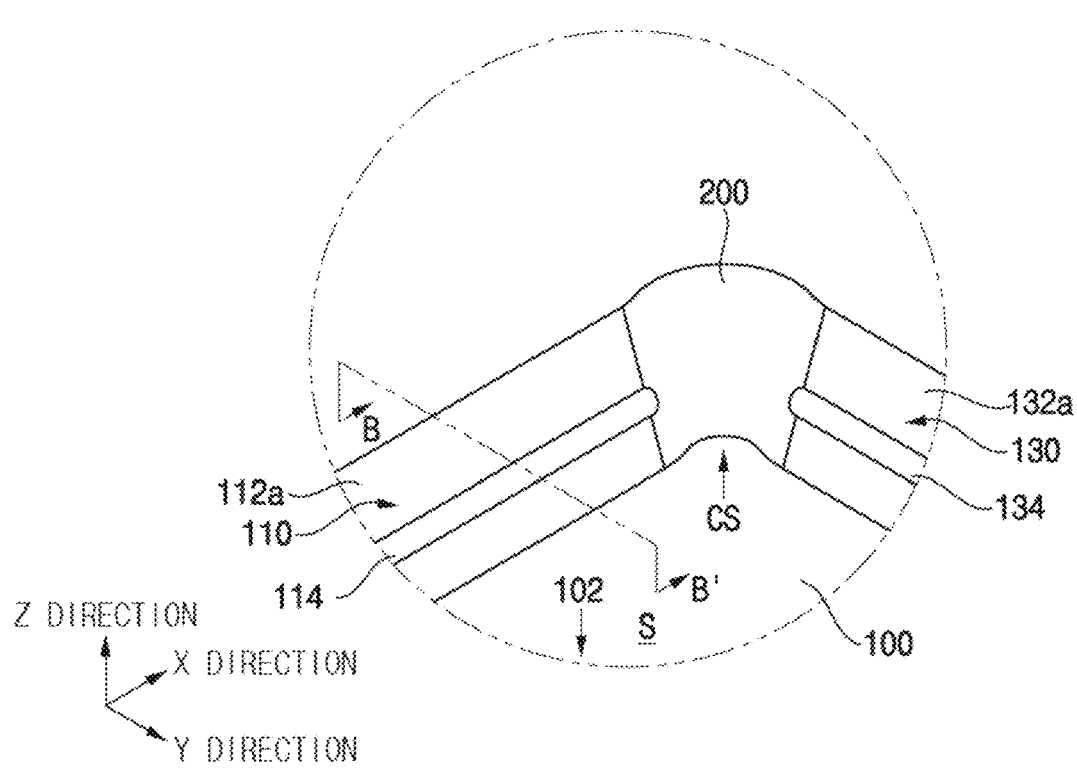
Figure 4:
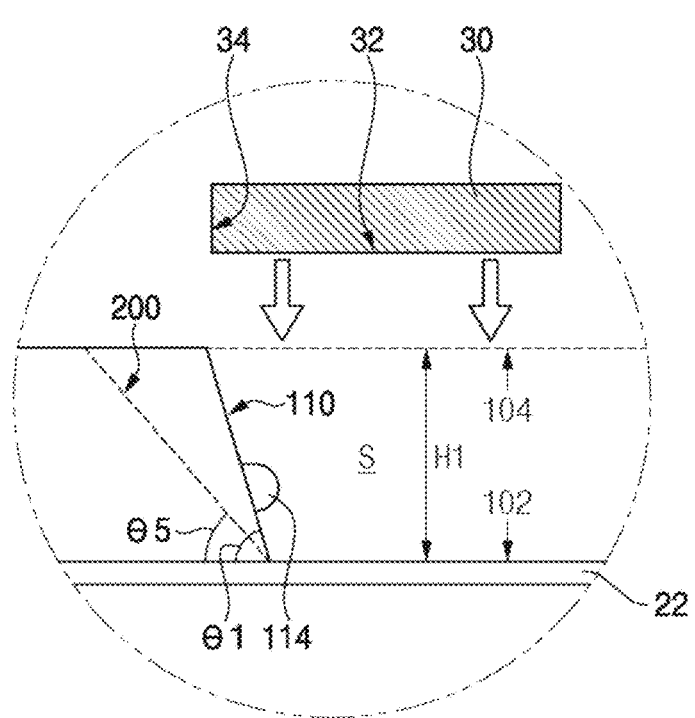
Figure 5:
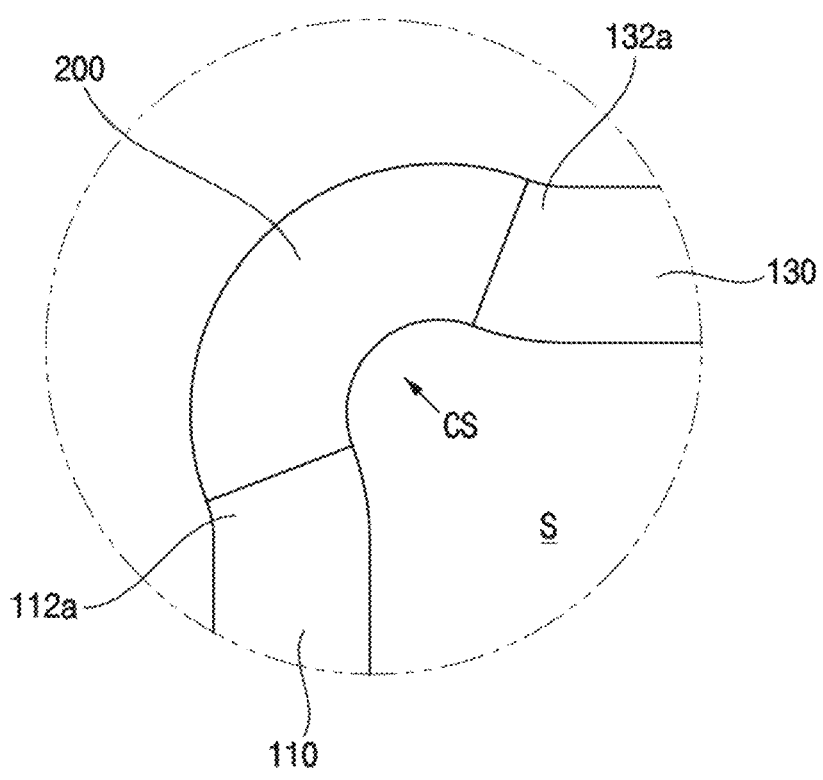

FIG. 1 is a perspective view illustrating a module tray for a semiconductor device in accordance with some example embodiments. FIG. 2 is a plan view illustrating the module tray in FIG. 1. FIG. 3 is an enlarged perspective view illustrating portion 'A' in FIG. 1. FIG. 4 is a plan view illustrating portion 'A' in FIG. 1. FIG. 5 is a cross-sectional view taken along line B-B' in FIG. 3.

Referring to FIGS. 1 to 5, a module tray 10 for a semiconductor device may include a case body 20 having at least one cavity 100 for accommodating the semiconductor device. The case body 20 may define the at least one cavity 100. For example, the case body 20 may define a first inner wall 110, a second inner wall 120, a third inner wall 130 and a fourth inner wall 140.

In some example embodiments, the module tray 10 may be referred to as a device for stably fixing, storing, and transporting the semiconductor devices. The module tray 10 may protect the semiconductor devices from external impacts. The module tray 10 may provide spaces that are configured for simultaneously accommodating and transporting a plurality of the semiconductor devices.

The semiconductor device accommodated into the module tray 10 may include a semiconductor substrate 30. For example, the semiconductor substrate 30 may be a printed circuit board (PCB) and/or a substrate on which a semiconductor package manufacturing process is performed. For example, the printed circuit board may be a multilayer circuit board having vias and various circuits therein.

The semiconductor substrate 30 may include a solid storage drive (SSD). The SSD may be referred to as a storage medium including NAND flash memory and a controller that controls the NAND flash memory, and may be referred to as a storage device having high read and write speeds and low power consumption. The SSD may include various types such as 2.5" (U.2, U.3), EDSFF, and M.2.

The semiconductor substrate 30 may include Dynamic Random Access Memory (DRAM). For example, the semiconductor substrate 30 may include DDR3, DDR4, DDR5, LPDDR (Low Power Double Data Rate), and the like. The module tray 10 may serve as a carrier for the semiconductor package manufacturing process by loading a plurality of semiconductor substrates 30 therein.

In some example embodiments, the module tray 10 may include a case body 20, and at least one cavity 100 provided within the case body 20 and defining an accommodating space S. The case body 20 may accommodate the semiconductor substrate 30 in the accommodating space S of the cavity 100.

The case body 20 may have a box body that has a rectangular parallelepiped shape as a whole and includes at least an opened portion of an upper surface. The case body 20 may have a base plate 22. The base plate 22 may extend parallel to the ground.

For example, the case body 20 may include a metal material such as stainless steel (Fe). Alternatively, the case body 20 may include a plastic material. For example, the plastic material may include polyethylene (PE), polypropylene (PP), polystyrene (PS), polyethylene terephthalate (PET), polyamides (PA), polyester (PES), polyvinyl chloride (PVC), polyurethanes (PU), polycarbonate (PC), polyvinylidene chloride (PVDC), etc.

The case body 20 may include the plastic material or the metal material having strong hardness and high toughness. When the semiconductor substrate 30 is inserted into the cavity 100, the case body 20 may protect the semiconductor substrate 30 that is accommodated therein, from external impact. In a state where the semiconductor substrate 30 is not accommodated in the case body 20, the case body 20 may be individually stored and managed. Since the case body 20 has a rectangular parallelepiped structure, a plurality of the case bodies 20 may be stacked on one another to be stored.

The case body 20 may be formed by a compression molding process. Alternatively, the case body 20 may be formed by an injection molding process, an extrusion molding process, a transfer molding process, a laminating molding process, a casting process, a thermoforming process, etc. The case body 20 formed by the compression molding process may be thin. For example, the case body 20 may have a thickness within a range of about 0.5 mm to 3 mm.

The cavity 100 may be defined by the first inner wall 110 and the second inner wall 120 of the case body 20 facing each other, and the third inner wall 130 and the fourth inner wall 140 of the case body 20 extending between the first and second inner walls 110 and 120. The case body 20 may further define first to fourth guide grooves 200, 210, 220 and 230 of the cavity 100 that are provided between the first to fourth inner walls 110, 120, 130, and 140, respectively. The case body 20 may define the cavity 100 as having an opened top 104. A width of the cavity 100 may gradually increase toward the opened top 104.

For example, a direction (Y direction) between the first inner wall 110 and the second inner wall 120 may be referred to as a second horizontal direction, a direction (X direction) between the third inner wall 130 and the fourth inner wall 140 may be referred to as a first horizontal direction, and a direction perpendicular to the first horizontal direction and the second horizontal direction is referred to as a vertical direction (Z direction).

The case body 20 may define plural cavities 100 that are arranged on the case body 20. The cavities 100 may be arranged on the case body 20 in a desired (and/or alternatively predetermined) array form. The cavities 100 may accommodate the semiconductor substrates 30, respectively. Alternatively, one cavity 100 may accommodate a plurality of the semiconductor substrates 30 stacked on each other. For example, the number of the cavities 100 may be within a range of 1 to 9.

In some example embodiments, it is illustrated that four cavities 100 are defined in the case body 20. However, some example embodiments are not limited thereto, and the case body 20 of the module tray 10 may define or include 6, 8, or 9 cavities arranged therein.

The cavity 100 may define an accommodating space S for accommodating the semiconductor substrate 30. One of the cavities 100 may be defined by the base plate 22, and the first to fourth inner walls 110, 120, 130, and 140 of the case body 20. When the module tray 10 includes a plurality of the cavities 100, a plurality of the inner walls may be further provided on the base plate 22.

The semiconductor substrate 30 may be accommodated into the cavity 100. A planar area of the semiconductor substrate 30 may be smaller than a planar area of the cavity 100. When viewed from a plan view, the semiconductor substrate 30 may be accommodated into the accommodating space S within the cavity 100.

The semiconductor substrate 30 may be accommodated into the cavity 100 such that a lower surface 32 of the semiconductor substrate faces a bottom surface 102 of the cavity 100. For example, when the semiconductor substrate 30 is accommodated into the cavity 100 with a lower surface 32 facing a bottom surface 102, a thickness direction thereof may be parallel to the vertical direction (Z direction). Alternatively, the semiconductor substrate 30 may be accommodated into the cavity 100 such that one side surface 34 of the semiconductor substrate faces the bottom surface 102 of the cavity 100. For example, when the semiconductor substrate 30 is accommodated into the cavity 100 with one side surface 34 facing the bottom surface 102, a longitudinal direction thereof may be parallel to the vertical direction (Z direction).

In some example embodiments, the first and second inner walls 110 and 120 of the case body 20 may extend in the vertical direction (Z direction) within the cavity 100 to define the accommodating space S. The first and second inner walls 110 and 120 may extend parallel to each other in the first horizontal direction (X direction).

The first inner wall 110 may have a pair of first end portions 112a and 112b provided at both ends. Each of the first end portions 112a and 112b may be inclined to have a first inclination angle θ1 with respect to the bottom surface 102. The semiconductor substrate 30 may be slidably accommodated into the accommodating space S through the first inclination angle θ1. Since each of the first end portions 112a and 112b have a first inclination angle θ1, when the semiconductor substrate 30 freely falls into the cavity 100, corner portions 30a and 30d of the semiconductor substrate 30 may slide down on the first end portions 112a and 112b to limit or prevent impact. For example, the first inclination angle θ1 may be within a range of about 30 degrees to 80 about degrees. Hereinafter, end portions 112a and 112b may be collectively referred to as end portions 112.

The second inner wall 120 may have a pair of second end portions 122a and 122b provided at both ends. Each of the second end portions 122a and 122b may be inclined to have a second inclination angle with respect to the bottom surface 102. The semiconductor substrate 30 may be slidably accommodated into the accommodating space S through the second inclination angle. Since each of the second end portions 122a and 122b have the second inclination angle, when the semiconductor substrate 30 freely falls into the cavity 100, corner portions 30b and 30c of the semiconductor substrate 30 may slide down on the second end portions 122a and 122b to limit or prevent impact. For example, the second inclination angle may be within a range of about 30 degrees to 80 degrees. The second inclination angle may be the same as the first inclination angle θ1. Hereinafter, end portions 122a and 122b may be collectively referred to as end portions 122.

The first and second inner walls 110 and 120 may have a fillet shape or a chamfer shape. The fillet shape may have a curved sectional shape. The chamfer shape may have an inclined sectional shape. The first and second inner walls 110 and 120 may limit or prevent impact with the corner portions of the semiconductor substrate 30 through the fillet shape or the chamfer shape. When the semiconductor substrate 30 freely falls on the cavity 100, the corner portions of the semiconductor substrate 30 may be accommodated into the cavity 100 by sliding down on the first and second inner walls 110 and 120 having the fillet shape or the chamfer shape.

The first and second inner walls 110 and 120 may further include first and second support portions 114 and 124 that protrude from the first and second inner walls 110 and 120, respectively. The first and second support portions 114 and 124 may protrude toward the accommodating space S from the first and second inner walls 110 and 120. When the semiconductor substrate 30 is accommodated into the accommodating space S, the first and second support portions 114 and 124 may support the lower surface 32 of the semiconductor substrate 30. For example, the first and second support portions 114 and 124 may have a curvature shape. The first and second support portions 114 and 124 may limit or prevent impact with the lower surface 32 of the semiconductor substrate 30 through the curvature shape.

In some example embodiments, the third and fourth inner walls 130 and 140 of the case body 20 may extend in the vertical direction (Z direction) within the cavity 100 to define the accommodating space S. The third and fourth inner walls 130 and 140 may extend parallel to each other in the second horizontal direction (Y direction).

The third inner wall 130 may have a pair of third end portions 132a and 132b provided at both ends. Each of the third end portions 132a and 132b may be inclined to have a third inclination angle with respect to the bottom surface 102. The semiconductor substrate 30 may be slidably accommodated into the accommodating space S through the third inclination angle. Since each of the third end portions 132a and 132b have the third inclination angle, when the semiconductor substrate 30 freely falls into the cavity 100, the corner portions 30a and 30b of the semiconductor substrate 30 may slide down on the third end portions 132a and 132b to limit or prevent impact. For example, the third inclination angle may be within a range of about 30 degrees to about 80 degrees. The third inclination angle may be the same as the first and second inclination angles. Hereinafter, end portions 132a and 132b may be collectively referred to as end portions 132.

The fourth inner wall 140 may have a pair of fourth end portions 142a and 142b provided at both ends. Each of the fourth end portions 142a and 142b may be inclined to have a fourth inclination angle with respect to the bottom surface 102. The semiconductor substrate 30 may be slidably accommodated into the accommodating space S through the fourth inclination angle. Since each of the fourth end portions 142a and 142b have the fourth inclination, when the semiconductor substrate 30 freely falls into the cavity 100, the corner portions 30c and 30d of the semiconductor substrate 30 may slide down on the fourth end portions 142a and 142b to limit or prevent impact. For example, the fourth inclination angle may be within a range of about 30 degrees to 80 degrees. The fourth inclination angle may be the same as the third inclination angle. Hereinafter, end portions 142a and 142b may be collectively referred to as end portions 142.

The third and fourth inner walls 130 and 140 may have the fillet shape or the chamfer shape. When the semiconductor substrate 30 freely falls in the cavity 100, the corner portions of the semiconductor substrate 30 may be accommodated into the cavity 100 by sliding down on the third and fourth inner walls 130 and 140 through the fillet shape or the chamfer shape.

The third and fourth inner walls 130 and 140 may further include third and fourth support portions 134 and 144 that protrude from the third and fourth inner walls 130 and 140, respectively. The third and fourth support portions 134 and 144 may protrude from the third and fourth inner walls 130 and 140 toward the accommodating space S. When the semiconductor substrate 30 is accommodated into the accommodating space S, the third and fourth support portions 134 and 144 may support the lower surface 32 of the semiconductor substrate 30. For example, the third and fourth support portions 134 and 144 may have the curvature shape. The third and fourth support portions 134 and 144 may limit or prevent impact with the lower surface 32 of the semiconductor substrate 30 through the curvature shape.

For example, a first height H1 between the opened top 104 and the base plate 22 may be within a range of about 50 mm to 400 mm. A first distance D1 between the first inner wall 110 and the second inner wall 120 may be less than a second distance D2 between the third inner wall 130 and the fourth inner wall 140. The first distance D1 between the first inner wall 110 and the second inner wall 120 may be within a range of 70 mm to 90 mm. The second distance D2 between the third inner wall 130 and the fourth inner wall 140 may be within a range of 100 mm to 120 mm.

In some example embodiments, the case body 20 may further define first to fourth guide grooves 200, 210, 220, and 230 provided between the first to fourth inner walls 110, 120, 130, and 140, respectively. The first to fourth guide grooves 200, 210, 220, and 230 may extend to connect between the first to fourth end portions 112, 122, 132, and 142 of the first to fourth inner walls 110, 120, 130, and 140.

The first to fourth guide grooves 200, 210, 220, and 230 may have a concave shape CS spaced apart from the corner portions 30a, 30b, 30c, and 30d of the semiconductor substrate 30, respectively. The concave shape CS may be a shape spaced apart from the first to fourth inner walls 110, 120, 130, and 140 toward a direction away from the accommodating space S. When the semiconductor substrate 30 is accommodated into the accommodating space S, the first to fourth guide grooves 200, 210, 220, and 230 might not contact the semiconductor substrate 30 through the concave shape CS. In a process of accommodating the semiconductor substrate 30 in the accommodation space S, the first to fourth guide grooves 200, 210, 220, and 230 may limit or prevent impact with the semiconductor substrate 30 through the concave shape CS. For example, when viewed from a plan view, the concave shape CS may include an arch shape. For example, the concave shape CS may include a circular shape.

The first to fourth guide grooves 200, 210, 220, and 230 may guide the semiconductor substrate 30 into the accommodating space S. The first to fourth guide grooves 200, 210, 220, and 230 may be inclined to have a fifth inclination angle θ5 with respect to the bottom surface 102. While the semiconductor substrate 30 contacts at least one of the first to fourth guide grooves 200, 210, 220, and 230, the semiconductor substrate 30 may be slidably accommodated into the accommodating space S. Since the first to fourth guide grooves 200, 210, 220, and 230 have the fifth inclination angle θ5, when the semiconductor substrate 30 freely falls into the cavity 100, the corner portions 30a, 30b, 30c, and 30d of the semiconductor substrate 30 may slide down on the first to fourth guide grooves 200, 210, 220, and 230 to limit or prevent impact. For example, the fifth inclination angle θ5 may be within a range of about 10 degrees to about 80 degrees.

The first guide groove 200 may be provided between the first and third inner walls 110 and 130. The first guide groove 200 may be provided between the first and third end portions 112a and 132a. The first guide groove 200 may extend to connect the first and third end portions 112a and 132a to each other.

The first guide groove 200 may have the concave shape CS to limit or prevent collision with the semiconductor substrate 30 that is inserted in the vertical direction (Z direction). While the semiconductor substrate 30 is accommodated into the accommodating space S, the semiconductor substrate 30 may collide with the first and third inner walls 110 and 130. When the semiconductor substrate 30 collides, cracks may occur in the semiconductor substrate 30. The first guide groove 200 may limit or prevent the collision with the corner portion 30a of the semiconductor substrate 30 through the concave shape CS.

The first guide groove 200 may have a curved shape for guiding the semiconductor substrate 30 that is inserted in the vertical direction (Z direction) into the accommodating space S. The first guide groove 200 may guide the semiconductor substrate 30 into the accommodating space S through the curved shape regardless of an insertion direction of the semiconductor substrate 30. For example, the first guide groove 200 may include a half funnel shape that narrows toward the bottom surface 102 of the cavity 100.

The first guide groove 200 may have a continuous curved surface from the first and third end portions 112a and 132a of the first and third inner walls 110 and 130. The first guide groove 200 may be smoothly connected to the first and third end portions 112a and 132a through the continuous curved surface. Since the first guide groove 200 is smoothly connected to the first and third end portions 112a and 132a through the continuous curved surface, when the corner portion 30a of the semiconductor substrate 30 contacts at least one of the first guide groove 200 and the first and third end portions 112a and 132a, the corner portion 30a of the semiconductor substrate 30 may be stably accommodated into the accommodating space S. For example, the continuous curved surface may smoothly connect the first inclination angle θ1 of the first end portion 112a, the third inclination angle of the third end portion 132a, and the fifth inclination angle θ5 of the first guide groove 200.

The second guide groove 210 may be provided between the second and third inner walls 120 and 130. The second guide groove 210 may be provided between the second and third end portions 122a and 132b. The second guide groove 210 may extend to connect the second and third end portions 122a and 132b to each other.

The second guide groove 210 may have the concave shape to limit or prevent the collision with the semiconductor substrate 30 that is inserted in the vertical direction (Z direction). While the semiconductor substrate 30 is accommodated into the accommodating space S, the semiconductor substrate 30 may collide with the second and third inner walls 120 and 130. The second guide groove 210 may limit or prevent the collision with the corner portion 30b of the semiconductor substrate 30 through the concave shape.

The second guide groove 210 may have the curved shape for guiding the semiconductor substrate 30 that is inserted in the vertical direction (Z direction) into the accommodating space S. The second guide groove 210 may guide the semiconductor substrate 30 into the accommodating space S through the curved shape regardless of the insertion direction of the semiconductor substrate 30. For example, the second guide groove 210 may include the half funnel shape narrowing toward the bottom surface 102 of the cavity 100.

The second guide groove 210 may have the continuous curved surface from the second and third end portions 122a and 132b of the second and third inner walls 120 and 130. The second guide groove 210 may be smoothly connected to the second and third end portions 122a and 132b through the continuous curved surface. Since the second guide groove 210 is smoothly connected to the second and third end portions 122a and 132b through the continuous curved surface, when the corner portion 30b of the semiconductor substrate 30 contacts at least one of the second guide groove 210 and the second and third end portions 122a and 132b, the corner portion 30b of the semiconductor substrate 30 may be stably accommodated into the accommodating space S. For example, the continuous curved surface may smoothly connect the second inclination angle of the second end portion 122a, the third inclination angle of the third end portion 132b, and the fifth inclination angle θ5 of the second guide groove 210.

The third guide groove 220 may be provided between the second and fourth inner walls 120 and 140. The third guide groove 220 may be provided between the second and fourth end portions 122b and 142a. The third guide groove 220 may extend to connect the second and fourth end portions 122b and 142a to each other.

The third guide groove 220 may have the concave shape to limit or prevent the collision with the semiconductor substrate 30 that is inserted in the vertical direction (Z direction). While the semiconductor substrate 30 is accommodated into the accommodating space S, the semiconductor substrate 30 may collide with the second and fourth inner walls 120 and 140. The third guide groove 220 may limit or prevent the collision with the corner portion 30c of the semiconductor substrate 30 through the concave shape.

The third guide groove 220 may have the curved shape for guiding the semiconductor substrate 30 that is inserted in the vertical direction (Z direction) into the accommodating space S. The third guide groove 220 may guide the semiconductor substrate 30 into the accommodating space S through the curved shape regardless of the insertion direction of the semiconductor substrate 30. For example, the third guide groove 220 may include the half funnel shape narrowing toward the bottom surface 102 of the cavity 100.

The third guide groove 220 may have the continuous curved surface from the second and fourth end portions 122b and 142a of the second and fourth inner walls 120 and 140. The third guide groove 220 may be smoothly connected to the second and fourth end portions 122b and 142a through the continuous curved surface. Since the third guide groove 220 is smoothly connected to the second and fourth end portions 122b and 142a through the continuous curved surface, when the corner portion 30c of the semiconductor substrate 30 contacts at least one of the third guide groove 220 and the second and fourth end portions 122b and 142a, the corner portion 30c of the semiconductor substrate 30 may be stably accommodated into the accommodating space S. For example, the continuous curved surface may smoothly connect the second inclination angle of the second end portion 122b, the fourth inclination angle of the fourth end portion 142a, and the fifth inclination angle θ5 of the third guide groove 220.

The fourth guide groove 230 may be provided between the first and fourth inner walls 110 and 140. The fourth guide groove 230 may be provided between the first and fourth end portions 112b and 142b. The fourth guide groove 230 may extend to connect the first and fourth end portions 112b and 142b to each other.

The fourth guide groove 230 may have the concave shape to limit or prevent the collision with the semiconductor substrate 30 that is inserted in the vertical direction (Z direction). While the semiconductor substrate 30 is accommodated into the accommodating space S, the semiconductor substrate 30 may collide with the first and fourth inner walls 110 and 140. The fourth guide groove 230 may limit or prevent the collision with the corner portion 30d of the semiconductor substrate 30 through the concave shape.

The fourth guide groove 230 may have the curved shape for guiding the semiconductor substrate 30 that is inserted in the vertical direction (Z direction) into the accommodating space S. The fourth guide groove 230 may guide the semiconductor substrate 30 into the accommodating space S through the curved shape regardless of the insertion direction of the semiconductor substrate 30. For example, the fourth guide groove 230 may include the half funnel shape narrowing toward the bottom surface 102 of the cavity 100.

The fourth guide groove 230 may have the continuous curved surface from the first and fourth end portions 112b and 142b of the first and fourth inner walls 110 and 140. The fourth guide groove 230 may be smoothly connected to the first and fourth end portions 112*b* and 142*b* through the continuous curved surface. Since the fourth guide groove 230 is smoothly connected to the first and fourth end portions 112*b* and 142*b* through the continuous curved surface, when the corner portion 30*d* of the semiconductor substrate 30 contacts at least one of the fourth guide groove 230 and the first and fourth end portions 112*b* and 142*b*, the corner portion 30*d* of the semiconductor substrate 30 may be stably accommodated into the accommodating space S. For example, the continuous curved surface may smoothly connect the first inclination angle θ1 of the first end portion 112*b*, the fourth inclination angle of the fourth end portion 142*b*, and the fifth inclination θ5 of the fourth guide groove 230.

As described above, the semiconductor substrate 30 may be accommodated into the cavity 100 defined by the case body 20 of the module tray 10. In the process of accommodating the semiconductor substrate 30 in the cavity 100, the corner portions 30*a*, 30*b*, 30*c* and 30*d* of the semiconductor substrate 30 may collide with an upper surface of the case body 20. Since the first to fourth guide grooves 200, 210, 220 and 230 of the cavity 100 have the concave shape from the first to fourth inner walls 110, 120, 130 and 140, the collision occurring between the corner portions 30*a*, 30*b*, 30*c* and 30*d* of the semiconductor substrate 30 and the first to fourth inner walls 110, 120, 130 and 140 may be limited or prevented.

Further, the first to fourth end portions 112, 122, 132 and 142 of the first to fourth inner walls 110, 120, 130 and 140 may be inclined at the first to fourth inclination angles, respectively. Since the first to fourth end portions 112, 122, 132 and 142 are inclined at the first to fourth inclination angles, the semiconductor substrate 30 may be slidably accommodated into the accommodating space S, and an impact generated between the semiconductor substrate 30 and the case body 20 may be alleviated or absorbed.

Since the first to fourth guide grooves 200, 210, 220 and 230 smoothly connect the first to fourth end portions 112, 122, 132 and 142 through desired (and/or alternatively predetermined) inclination angles, when the corner portions 30*a*, 30*b*, 30*c* and 30*d* of the semiconductor substrate 30 collide with the first to fourth guide grooves 200, 210, 220 and 230, an impact applied to the corner portions 30*a*, 30*b*, 30*c* and 30*d* of the semiconductor substrate 30 may be alleviated or absorbed.

Figure 6:
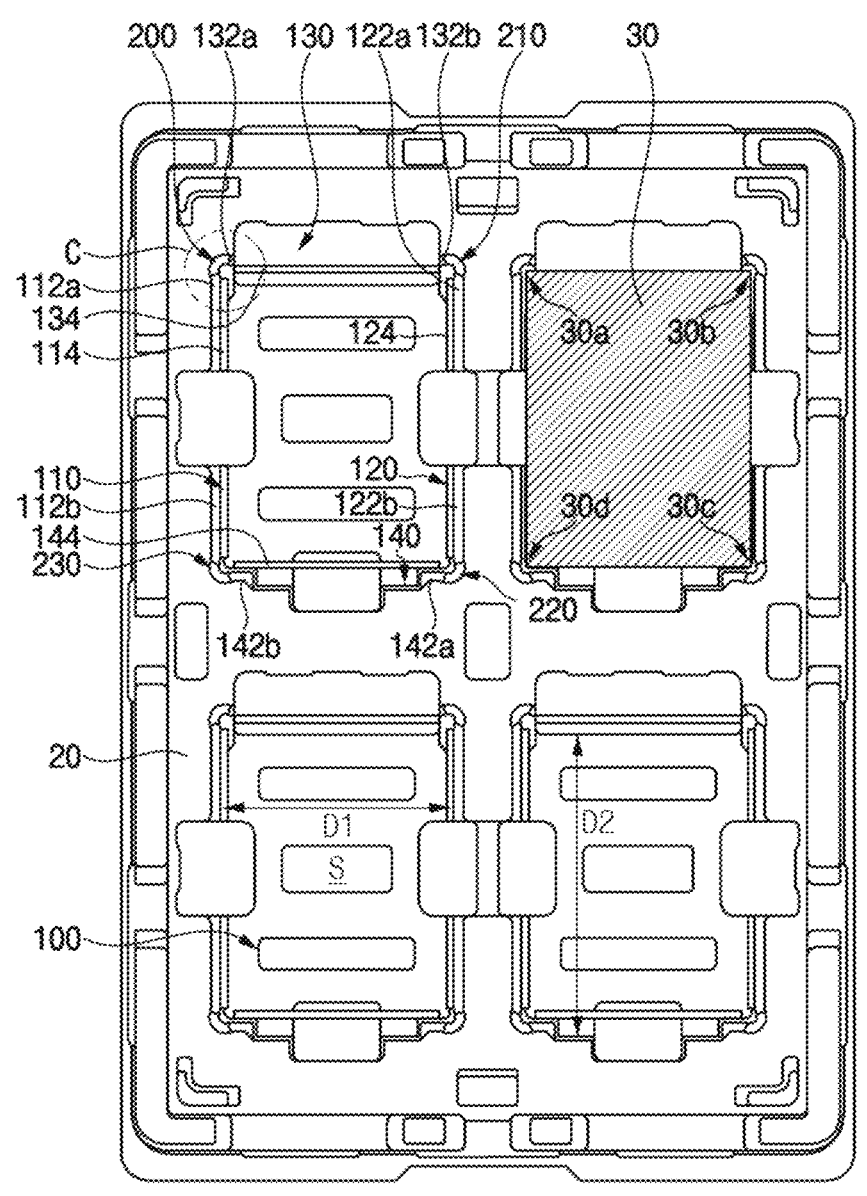
Figures 7, 8:
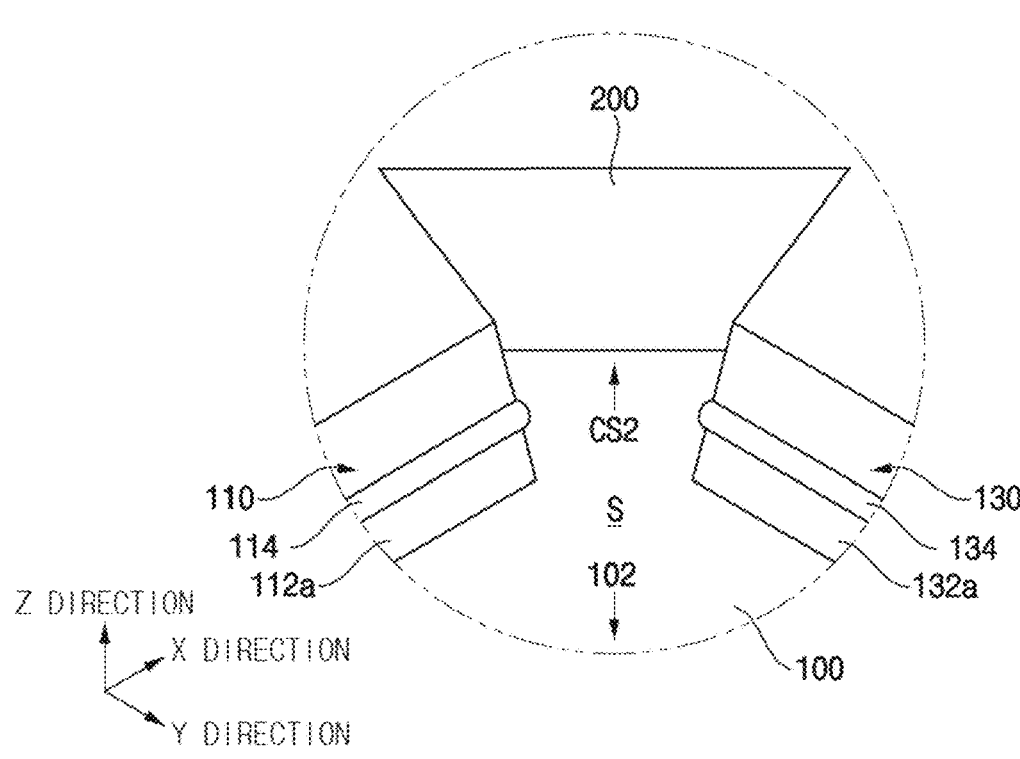
Figure 9:
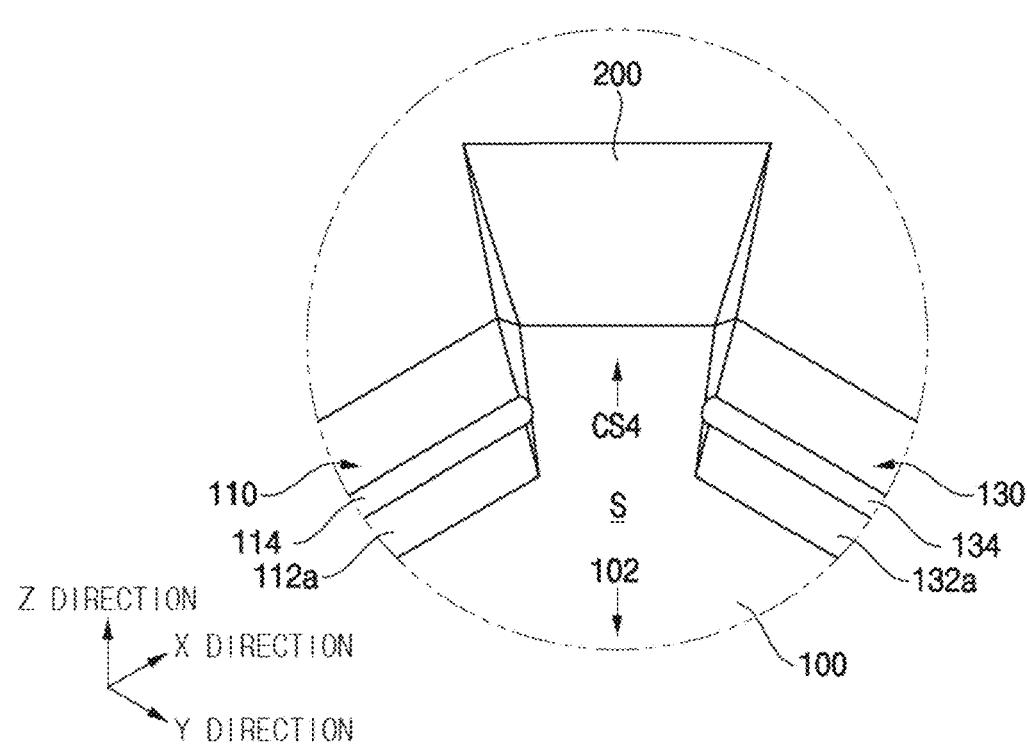
Figure 10:
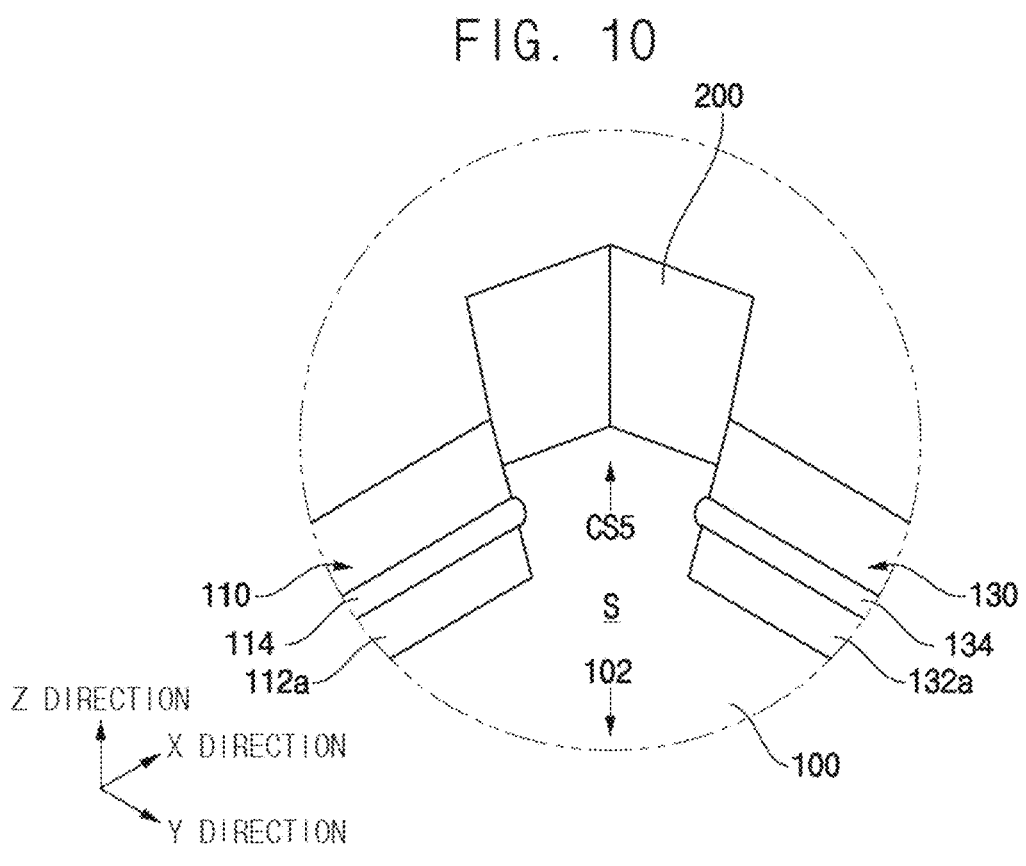

FIG. 6 is a plan view illustrating a module tray for a semiconductor device having guide grooves of a modified shape in accordance with some example embodiments. FIGS. 7 to 11 are enlarged perspective views illustrating portion 'C' in FIG. 6 in accordance with some example embodiments. The module tray in FIGS. 6-11 may be substantially the same as or similar to the module tray described with reference to FIGS. 1 to 5 except for a configuration of guide grooves. Thus, same or similar components are denoted by the same or similar reference numerals, and repeated descriptions of the same components will be omitted.

In FIGS. 6 to 11, a module tray 12 may include a case body 20, and the case body 20 may define at least one cavity 100 provided within the case body 20 and defining an accommodating space S.

In some example embodiments, first to fourth guide grooves 200, 210, 220, and 230 may be provided between first to fourth inner walls 110, 120, 130, and 140, respectively. First to fourth guide grooves 200, 210, 220, and 230 may extend to connect between the first to fourth end portions 112, 122, 132, and 142 of the first to fourth inner walls 110, 120, 130, and 140.

The first to fourth guide grooves 200, 210, 220, and 230 may have a concave shape CS spaced apart from corner portions 30*a*, 30*b*, 30*c*, and 30*d* of the semiconductor substrate 30. When the semiconductor substrate 30 is accommodated in the accommodating space S, the first to fourth guide grooves 200, 210, 220, and 230 might not contact the semiconductor substrate 30 through the concave shape CS. In the process of accommodating the semiconductor substrate 30 into the accommodating space S, the first to fourth guide grooves 200, 210, 220, and 230 may limit or prevent impact with the semiconductor substrate 30 through the concave shape CS.

For example, as illustrated in respective FIGS. 7 to 11, the concave shape CS may include a triangular shape CS2, a square shape CS3, a rhombic shape CS4, a pentagonal shape CS5, and a hexagonal shape CS6. The concave shape CS may vary according to a type of semiconductor substrate 30. The concave shape CS may be designed in consideration of the type of semiconductor substrate 30 that is accommodated into the cavity 100. The concave shape CS may vary according to shapes of the corner portions 30*a*, 30*b*, 30*c*, and 30*d* of the semiconductor substrate 30 that is accommodated into the cavity 100. The concave shape CS may be designed to have an optimal or desired shape capable of limiting or preventing the collision with the corner portions 30*a*, 30*b*, 30*c*, and 30*d* of the semiconductor substrate 30.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the inventive concepts. Accordingly, all such modifications are intended to be included within the scope of example embodiments as defined in the claims.

What is claimed is:

1. A module tray for a semiconductor device, comprising:
   a case body defining at least one cavity therein, the at least one cavity having a bottom surface and the at least one cavity being configured to accommodate a semiconductor substrate,
   wherein the case body defines
   a first inner wall and a second inner wall of the at least one cavity extending parallel to each other in a first horizontal direction, the first inner wall and the second inner wall respectively having first end portions and second end portions that are inclined at a first inclination angle and a second inclination angle with respect to the bottom surface, respectively,
   a third inner wall and a fourth inner wall of the at least one cavity extending parallel to each other in a second horizontal direction orthogonal to the first horizontal direction, the third inner wall and the fourth inner wall respectively having third end portions and fourth end portions that are inclined at a third inclination angle and a fourth inclination angle with respect to the bottom surface, respectively, and
   a first guide groove extending to connect the first inner wall to the third inner wall, a second guide groove extending to connect the third inner wall to the second inner wall, a third guide groove extending to connect the second inner wall to the fourth inner wall, and a fourth guide groove extending to connect the fourth inner wall to the first inner wall, the first guide groove, the second guide groove, the third guide groove and the fourth guide groove having a concave shape and configured to be spaced apart from corner portions of the semiconductor substrate accommodated into the at least one cavity, wherein the first inner wall, the second inner wall, the third inner wall and the fourth inner wall respectively further include a first support portion, a second support portion, a third support portion and a fourth support portion that are configured to respectively extend horizontally to, and end at, the first end portions, the second end portions, the third end portions and the fourth end portions and to support the semiconductor substrate accommodated into the at least one cavity, and each of the first support portion, the second support portion, the third support portion and the fourth support portion has a curvature shape.

2. The module tray of claim 1, wherein each of the first inclination angle, the second inclination angle, the third inclination angle and the fourth inclination angle is within a range of 30 degrees to 80 degrees.

3. The module tray of claim 1, wherein each of the first guide groove, the second guide groove, the third guide groove and the fourth guide groove has a fifth inclination angle from the bottom surface, and the fifth inclination angle is within a range of 10 degrees to 80 degrees.

4. The module tray of claim 1, wherein each of the first guide groove, the second guide groove, the third guide groove and the fourth guide groove has a half funnel shape narrowing toward the bottom surface.

5. The module tray of claim 1, wherein the concave shape includes at least one of a circular shape, a square shape, a triangular shape, a rhombic shape, a pentagonal shape, and a hexagonal shape in plan view.

6. The module tray of claim 1, wherein the first guide groove, the second guide groove, the third guide groove and the fourth guide groove extend from respective ones of the first end portions, the second end portions, the third end portions and the fourth end portions as having a continuous curved surface.

7. The module tray of claim 1, wherein the first inner wall, the second inner wall, the third inner wall and the fourth inner wall include at least one of a fillet shape and a chamfer shape.

8. The module tray of claim 1, wherein the case body defines the at least one cavity as plural cavities within a range of 1 to 9.

9. The module tray of claim 1, wherein the semiconductor substrate when accommodated into the at least one cavity has a lower surface or one side surface of the semiconductor substrate facing the bottom surface.

10. A module tray for a semiconductor device, comprising:

a case body having a base plate, and the case body defining at least one cavity therein as an accommodating space for accommodating a semiconductor substrate, wherein the case body defines a first inner wall and a second inner wall of the at least one cavity respectively extending in a first horizontal direction, the first inner wall and the second inner wall respectively having first end portions and second end portions that are inclined at a first inclination angle and a second inclination angle from a bottom surface of the at least one cavity, respectively, a third inner wall and a fourth inner wall of the at least one cavity respectively extending in a second horizontal direction orthogonal to the first horizontal direction, the third inner wall and the fourth inner wall respectively having third end portions and fourth end portions that are inclined at a third inclination angle and a fourth inclination angle from the bottom surface, respectively, and a first guide groove extending from the first inner wall to the third inner wall, a second guide groove extending from the third inner wall to the second inner wall, a third guide groove extending from the second inner wall to the fourth inner wall, and a fourth guide groove extending from the fourth inner wall to the first inner wall, each of the first guide groove, the second guide groove, the third guide groove and the fourth guide groove having a continuous curved surface, and having a concave shape configured to guide the semiconductor substrate into the accommodating space, wherein the first inner wall, the second inner wall, the third inner wall and the fourth inner wall respectively further include a first support portion, a second support portion, a third support portion and a fourth support portion that are configured to respectively extend horizontally to, and end, at the first guide groove, the second guide groove, the third guide groove and the fourth guide groove, and to support the semiconductor substrate accommodated into the at least one cavity, and each of the first support portion, the second support portion, the third support portion and the fourth support portion has a curvature shape.

11. The module tray of claim 10, wherein each of the first inclination angle, the second inclination angle, the third inclination angle and the fourth inclination angle is within a range of 30 degrees to 80 degrees.

12. The module tray of claim 10, wherein each of the first guide groove, the second guide groove, the third guide groove and the fourth guide groove has a fifth inclination angle with respect to the bottom surface, and the fifth inclination angle is within a range of 10 degrees to 80 degrees.

13. The module tray of claim 10, wherein each of the first guide groove, the second guide groove, the third guide groove and the fourth guide groove has a half funnel shape narrowing toward the bottom surface.

14. The module tray of claim 10, wherein the concave shape includes at least one of a circular shape, a square shape, a triangular shape, a rhombic shape, a pentagonal shape and a hexagonal shape, in plan view.

15. The module tray of claim 10, wherein the first inner wall, the second inner wall, the third inner wall and the fourth inner wall include at least one of a fillet shape and a chamfer shape.

16. The module tray of claim 10, wherein the case body defines the at least one cavity as plural cavities within a range of 1 to 9.

17. The module tray of claim 10, wherein the semiconductor substrate when accommodated into the at least one cavity has a lower surface or one side surface of the semiconductor substrate facing the bottom surface.

18. A module tray for a semiconductor device, comprising:

a case body having a base plate, and defining at least one cavity therein as an accommodating space to accommodate a semiconductor substrate, wherein the case body defines a first inner wall and a second inner wall of the at least one cavity extending parallel to each other in a first horizontal direction, the first inner wall and the second inner wall respectively having first end portions and second end portions inclined at a first inclination angle and a second inclination angle with respect to the base plate, respectively, a third inner wall and a fourth inner wall of the at least one cavity extending parallel to each other in a second horizontal direction orthogonal to the first horizontal direction, the third inner wall and the fourth inner wall respectively having third end portions and fourth end portions inclined at a third inclination angle and a fourth inclination angle with respect to the base plate, respectively, and a first guide groove extending from the first inner wall to the third inner wall, a second guide groove extending from the third inner wall to the second inner wall, a third guide groove extending from the second inner wall to the fourth inner wall, and a fourth guide groove extending from the fourth inner wall to the first inner wall, the first guide groove, the second guide groove, the third guide groove and the fourth guide groove each having a continuous curved surface, and having a half funnel shape narrowing toward the base plate and configured to guide corner portions of the semiconductor substrate to the accommodating space, respectively, wherein the first inner wall, the second inner wall, the third inner wall and the fourth inner wall respectively further include a first support portion, a second support portion, a third support portion and a fourth support portion that are configured to respectively extend horizontally to, and end at, the first guide groove, the second guide groove, the third guide groove and the fourth guide groove, and to support the semiconductor substrate accommodated into the at least one cavity, and each of the first support portion, the second support portion, the third support portion and the fourth support portion has a curvature shape.

* * * * *